United States Patent [19]

Yokoi

[11] Patent Number: 5,144,237

[45] Date of Patent: Sep. 1, 1992

[54] METHOD AND APPARATUS OF NUCLEAR MAGNETIC RESONANCE IMAGING WITH OPTIMIZED GRADIENT MAGNETIC FIELD POWER SOURCE

[75] Inventor: Motohisa Yokoi, Tochigi, Japan

[73] Assignee: Kabushiki Kaisha Toshiba, Kawasaki, Japan

[21] Appl. No.: 544,421

[22] Filed: Jun. 27, 1990

[30] Foreign Application Priority Data

Jun. 29, 1989 [JP] Japan .................. 1-165355

[51] Int. Cl.⁵ ............................................. G01B 33/20
[52] U.S. Cl. ........................................ 324/309; 324/322
[58] Field of Search ............... 324/300, 307, 309, 318, 324/322; 363/132; 361/152; 307/268

[56] References Cited

U.S. PATENT DOCUMENTS

| 4,437,053 | 3/1984 | Bax ................... 324/322 |
| 4,644,277 | 2/1987 | Kunz ................. 324/309 |
| 4,670,716 | 6/1987 | Kunz ................. 324/309 |
| 4,733,342 | 3/1988 | Mueller et al. ...... 324/322 |

FOREIGN PATENT DOCUMENTS

| 0150541 | 8/1985 | European Pat. Off. . |
| 0156442 | 10/1985 | European Pat. Off. . |
| 0250718 | 1/1988 | European Pat. Off. . |
| 0291157 | 11/1988 | European Pat. Off. . |
| 1-110354 | 4/1989 | Japan . |
| 2208768A | 4/1989 | United Kingdom . |

Primary Examiner—Michael J. Tokar
Attorney, Agent, or Firm—Foley & Lardner

[57] ABSTRACT

A method and an apparatus of nuclear magnetic resonance imaging, capable of minimizing a wasteful unproductive power capacity of the gradient magnetic field power source. A required amount of current is supplied to the gradient magnetic field coil by a basic power source for supplying the current up to a predetermined amount to the gradient magnetic field coil, and by a plurality of power source elements, each capable of supplying a prescribed amount of current, for supplementing the basic power source by using a necessary number of the power source elements such that a total amount of current supplies by the basic power source and the power source elements becomes equal to the required amount of current.

6 Claims, 6 Drawing Sheets

METHOD AND APPARATUS OF NUCLEAR MAGNETIC RESONANCE IMAGING WITH OPTIMIZED GRADIENT MAGNETIC FIELD POWER SOURCE

BACKGROUND OF THE INVENTION

1. Field of the Invention

The present invention relates to a nuclear magnetic resonance imaging apparatus for obtaining nuclear magnetic resonance images of an object to be examined.

2. Description of the Background Art

As is well known, in a nuclear magnetic resonance imaging apparatus, a nuclear magnetic resonance image is obtained by placing an object to be examined in a static magnetic field; applying a high frequency magnetic field (RF pulse) in a direction perpendicular to that of the static magnetic field in order to induce a nuclear magnetic resonance phenomenon in the object to be examined; superposing gradient magnetic fields $G_X$, $G_Y$, and $G_Z$ in X, Y, and Z directions, respectively, onto the static magnetic field, for the sake of tomographic imaging; collecting nuclear magnetic resonance signals due to the induced nuclear magnetic resonance phenomenon from the object to be examined; and image processing the collected nuclear magnetic resonance signals.

In such a nuclear magnetic resonance imaging apparatus, the gradient magnetic fields $G_X$, $G_Y$, and $G_Z$ are produced by using X-, Y-, and Z-gradient magnetic field coils provided in correspondence with X, Y, and Z axes, respectively, each of which is equipped with an independent power source of the same power capacity.

In terms of functions, the gradient magnetic fields can be considered as comprising three orthogonal fields of a slicing gradient magnetic field $G_S$ for determining a slicing plane of tomographic imaging, a phase encoding gradient magnetic field $G_E$ for providing coordinate information on the slicing plane, and a reading gradient magnetic field $G_R$ for tomographic extraction of the nuclear magnetic resonance signals.

These gradient magnetic fields are obtained as a field given by superposition of three orthogonal gradient magnetic fields $G_X$, $G_Y$, and $G_Z$ in X, Y, and Z directions, respectively. For example, a total gradient magnetic field $G_0$ shown in FIG. 1 can be obtained from three orthogonal gradient magnetic fields $G_X$, $G_Y$, and $G_Z$, and this total gradient magnetic field $G_0$ can be taken as composed from three components corresponding to the slicing gradient magnetic field $G_S$, the phase encoding gradient magnetic field $G_E$, and the reading gradient magnetic field $G_R$.

Now, in a conventional nuclear magnetic resonance imaging apparatus, each of X-, Y-, and Z-gradient magnetic field coils is equipped with an independent power source of the same power capacity, so that, by assuming that a maximum power of each power source to be 1, a total power capacity of these power sources is equal to 3. However, in order to be able to take an image at an arbitrary cross section, a maximum total power required from these power sources is at most $1/\sqrt{3} \times 3 = \sqrt{3} \approx 1.73$ occurring in a case of a total gradient magnetic field obliquely inclined by 45° from all of X, Y, and Z axes.

Thus, in a conventional nuclear magnetic resonance imaging apparatus, over 40% of the total power capacity of the power sources for the gradient magnetic field coils has always been wasted as unproductive power capacity.

This situation is particularly problematic in using a modern imaging technique, such as an echo planer method, in which the required power for the reading gradient magnetic field is much larger than the required powers for the slicing gradient magnetic field and the phase encoding gradient magnetic field. In such a case, the conventional provision of providing three independent power sources of the same power capacities produces a waste of a very large amount of power.

SUMMARY OF THE INVENTION

It is therefore an object of the present invention to provide a method and an apparatus of nuclear magnetic resonance imaging, capable of minimizing a wasteful unproductive power capacity of the gradient magnetic field power source.

According to one aspect of the present invention, there is provided a nuclear magnetic resonance imaging apparatus, comprising: means for generating a static magnetic field; X-, Y-, and Z-gradient magnetic field for generating gradient magnetic field to be superposed on the static magnetic field in X, Y, and Z directions; means for supplying a required amount of current to the gradient magnetic field coil means, including: basic power source for supplying the current up to a predetermined amount to the gradient magnetic field coil means; a plurality of power source elements, each capable of supplying a prescribed amount of current, for supplementing the basic power source by using a necessary number of the power source elements such that a total amount of current supplied by the basic power source and the power source elements becomes equal to the required amount of current; means for applying RF pulses onto an object to be examined placed in the static magnetic field; means for collecting nuclear magnetic resonance signals from the object to be examined resulting from the RF pulse; and means for processing the collected nuclear magnetic resonance signals.

According to another aspect of the present invention there is provided a method of nuclear magnetic resonance imaging, comprising the steps of: generating a static magnetic field; generating gradient magnetic field to be superposed on the static magnetic field in X, Y, and Z directions by X-, Y-, and Z-gradient magnetic field supplying a required amount of current to the gradient magnetic field coils, including the steps of: supplying the current up to a predetermined amount to the gradient magnetic field coils by basic power source; supplementing the basic power source with a plurality of power source elements, each capable of supplying a prescribed amount of current, by using a necessary number of the power source elements such that a total amount of current supplied by the basic power source and the power source elements becomes equal to the required amount of current; applying RF pulses onto an object to be examined placed in the static magnetic field; collecting nuclear magnetic resonance signals from the object to be examined resulting from the RF pulse; and processing the collected nuclear magnetic resonance signals.

Other features and advantages of the present invention will become apparent from the following description taken in conjunction with the accompanying drawings.

DETAILED DESCRIPTION OF THE PREFERRED EMBODIMENTS

Figure 1:
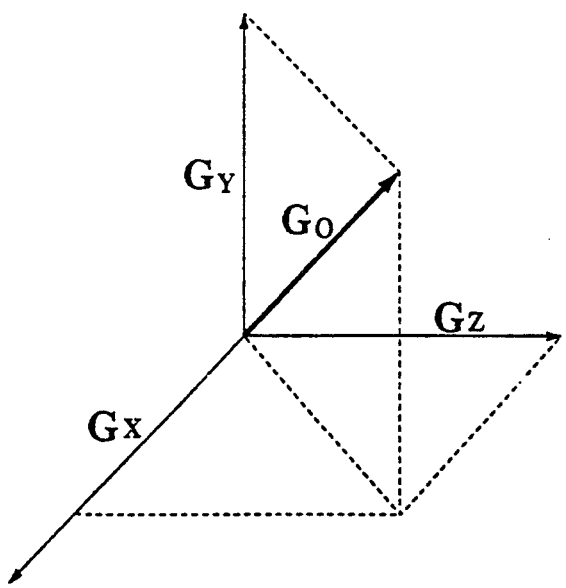
FIG. 1 is a vector diagram representing gradient magnetic fields in a conventional nuclear magnetic resonance imaging apparatus.
Figure 2:
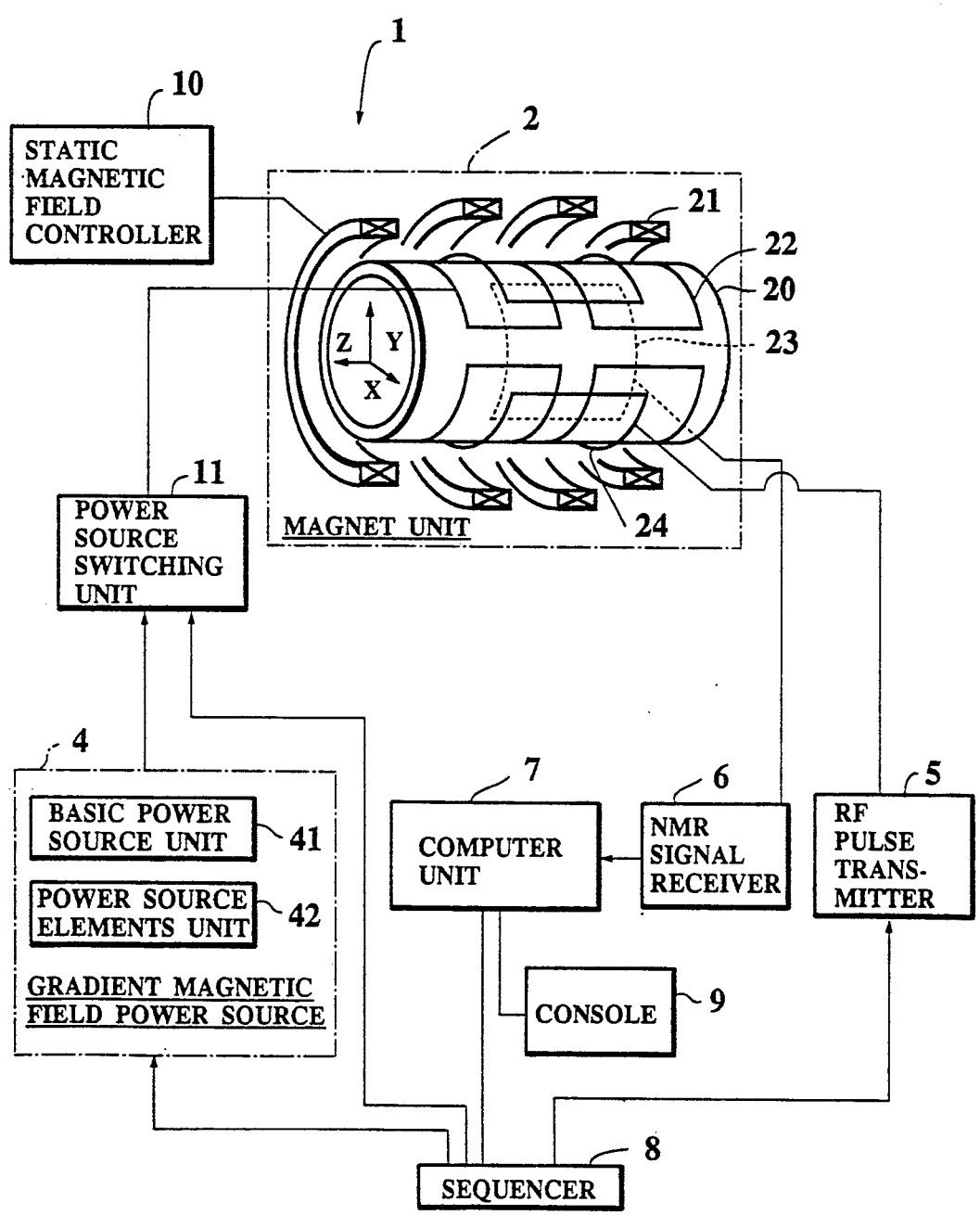
FIG. 2 is a schematic block diagram of one embodiment of a nuclear magnetic resonance imaging apparatus according to the present invention.

Referring now to FIG. 2, there is shown one embodiment of a nuclear magnetic resonance imaging apparatus according to the present invention.

In this embodiment, the nuclear magnetic resonance imaging apparatus 1 comprises a magnet unit 2 containing a static magnetic field coil 21, gradient magnetic field coils 22, a nuclear magnetic resonance (NMR) signal detector coil 23, and an RF pulse transmitter coil 24, all of which are provided on a coil core 20; a gradient magnetic field power source 4 for supplying currents to the gradient magnetic field coils 22, which includes a basic power source unit 41 and a power source elements unit 42 to be described in detail below; an RF pulse transmitter 5 for applying RF pulses to the RF pulse transmitter coil 24; a nuclear magnetic resonance signal receiver 6 for receiving the nuclear magnetic resonance signals detected by the nuclear magnetic resonance signal detector coil 23; a computer unit 7 for controlling operations of the apparatus; a sequencer 8 for controlling operations of the gradient magnetic field power source 4 and the RF pulse transmitter 5; a console 9 including a CRT display for displaying nuclear magnetic resonance images and a keyboard for entering commands such as imaging conditions; a static magnetic field controller 10 for controlling the static magnetic field coil 21, and a power source switching unit 11 containing a plurality of switches for selectively controlling the power source elements unit 42 in order to control the currents supplied to the gradient magnetic field coils 22.

Figure 3:
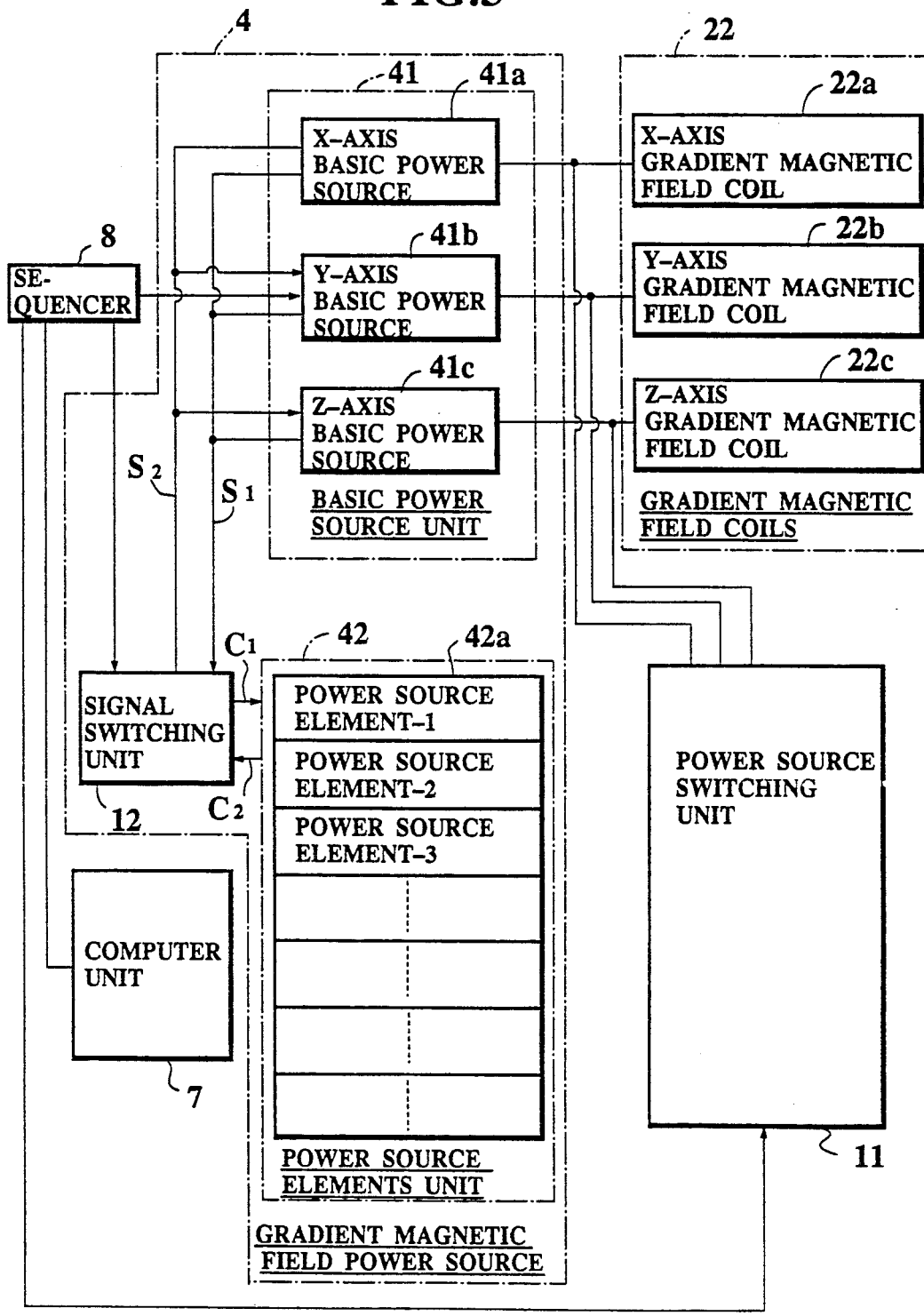
FIG. 3 is a detailed block diagram of a main portion of the embodiment of a nuclear magnetic resonance imaging apparatus of FIG. 2.

In detail, as shown in FIG. 3, the gradient magnetic field coils 22 comprises an X-axis gradient magnetic field coil 22a, a Y-axis gradient magnetic field coil 22b, and a Z-axis gradient magnetic field coil 22c, while the basic power source unit 41 comprises an X-axis basic power source 41a, a Y-axis basic power source 41b, and a Z-axis basic power source 41c, in correspondence with the gradient magnetic filed coils 22. Each of these X-, Y-, and Z-axis basic power sources has 1/10 of a power capacity of a single conventional gradient magnetic field coil power source for one gradient magnetic field coil which is assumed to be 1.

Meanwhile, the power source elements unit 42 comprises a plurality of power source elements 42a such as a power source element-1, power source element-2, etc. Each power source element 42a of the power source elements unit 42 has the power capacity of less than 1/10.

Combining the basic power source unit 41 and the power source elements unit 42 together, the gradient magnetic field power source 4 as a whole has the power capacity of approximately 1.73 times a maximum required power capacity for each of X-, Y-, and Z-channels.

When the imaging conditions are specified at the console 9, in accordance with the specified imaging conditions, the computer unit 7 controls the sequencer 8 which in turn controls the gradient magnetic field power source 4 and the power source switching unit 11, such that the appropriate amounts of currents are supplied to the gradient magnetic field coils 22 by using the basic power source unit 41 and a necessary number of power source elements 42a of the power source elements unit 42.

The gradient magnetic field power source 4 further includes a signal switching unit 12 for converting a current C2 outputted by the power source elements unit 42 indicating an amount of current presently supplied by the power source elements unit 42 into a current level signal S2 to be given to the basic power source unit 41, and transmitting a current supply request signal S1 indicating an amount of current needed to be supplied from the power source elements unit 42, from the basic power source unit 41 to the power source elements unit 42.

Figure 4:
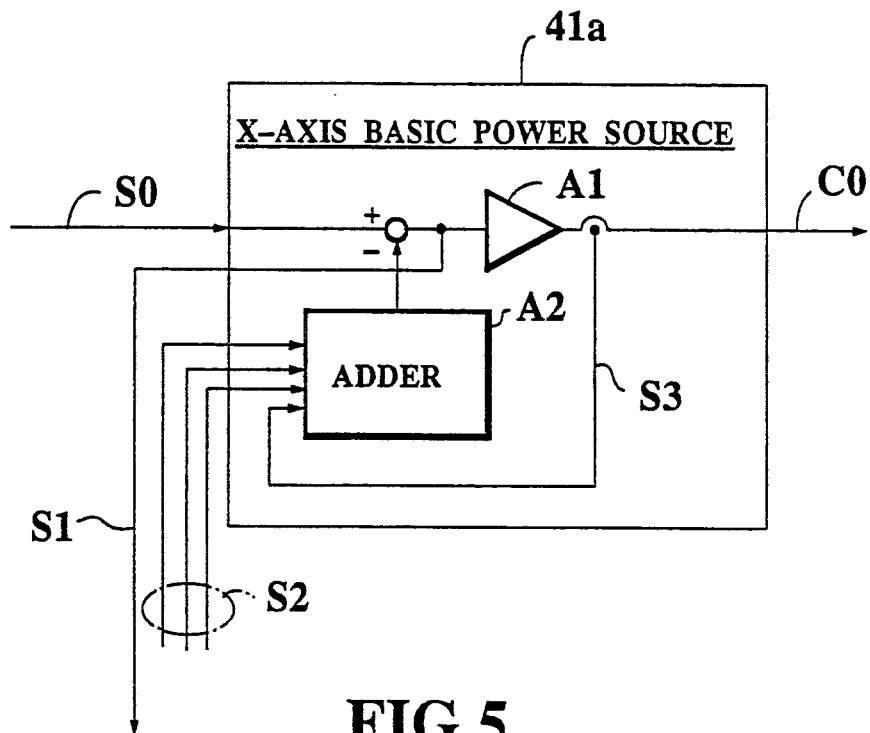
FIG. 4 is a block diagram for a basic power source unit of the embodiment of a nuclear magnetic resonance imaging apparatus of FIG. 2.

Now, as shown in FIG. 4, the X-axis basic power source 41a contains a feed-back configuration formed by an amplifier A1 and an adder A2. The current level signal S2 from the power source elements unit 42 and an output current level signal S3 indicating an amount of output current C0 of the amplifier A1 are added by the adder A2 and this sum is subtracted from a control signal S0 coming from the sequencer 8 indicating an amount of the current to be supplied to the X-axis gradient magnetic field coil 22a. The difference thus obtained is fed to the power source elements unit 42 as the current supply request signal S1, so that a necessary number of the power source elements 42a of the power source elements unit 42 can be employed to supplement the output current C0 of the X-axis basic power source 41a, and an appropriate amount of current can be supplied to the X-axis gradient magnetic field coil 22a by the gradient magnetic field power source 4 as a whole. The Y-axis basic power source 41b and the Z-axis basic power source 41c are constructed similarly.

Thus, this apparatus 1 operates as follows.

First, the imaging conditions are entered from the console 9 under the control of the computer unit 7, the sequencer 8 controls the gradient magnetic field power source 4 and the power source switching unit 11, so as to supply appropriate amounts of current to the gradient magnetic field coils 22.

Figure 5:
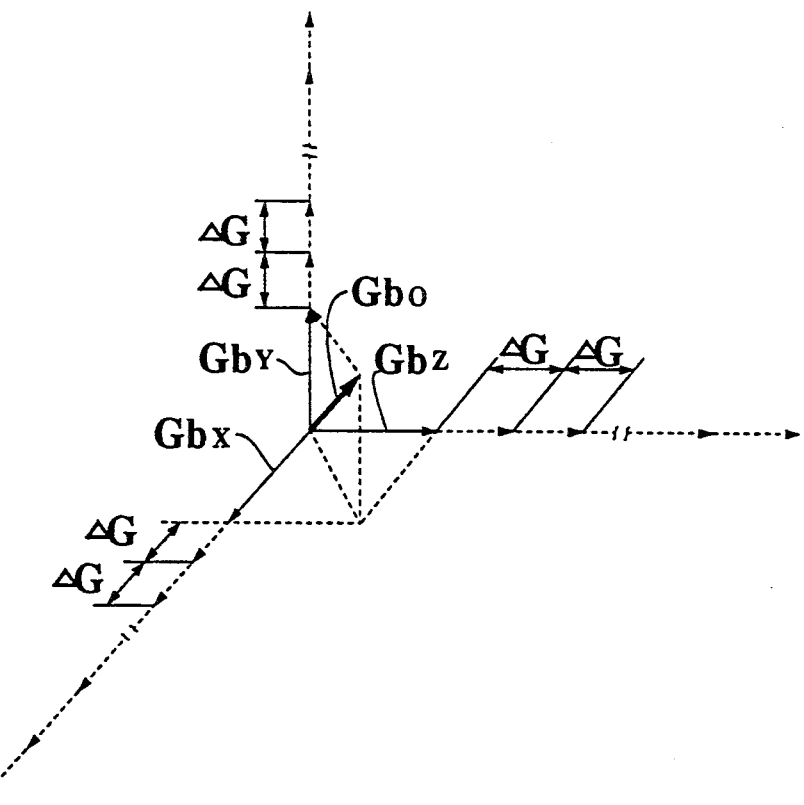
FIG. 5 is a vector diagram representing gradient magnetic fields generated by the embodiment of a nuclear magnetic resonance imaging apparatus of FIG. 2.

For example, as shown in FIG. 5, when the gradient magnetic field to be produced is Gb0, such an amount of current is supplied to the X-axis gradient magnetic field coil 22a that an X-axis gradient magnetic field $Gb_X$ is produced, while such an amount of current is supplied to the Y-axis gradient magnetic field coil 22b that a Y-axis gradient magnetic field $Gb_Y$ is produced, and such an amount of current is supplied to the Z-axis gradient magnetic field coil 22c that an Z-axis gradient magnetic field Gb$_Z$ is produced.

Here, as shown in FIG. 5, each of the X-axis gradient magnetic field Gb$_X$, Y-axis gradient magnetic field Gb$_Y$, and Z-axis gradient magnetic field Gb$_Z$ can be increased in units of an increment ΔG corresponding to the addition of one power source element 42a from the power source elements unit 42, so that any other desired gradient magnetic field can be obtained by using suitable numbers of the power source elements 42a for each gradient magnetic field component.

As another example, when the gradient magnetic field to be produced is along the Z-axis and of magnitude 1, as in a case of applying a slicing gradient magnetic field for a slicing plane normal to the Z-axis, since the Z-axis basic power source 41c has the power capacity of only 1/10, nine additional power source elements of power capacity 1/10 are employed from the power source elements unit 42 for the Z-axis gradient magnetic field coil 22c by the power source switching unit 11.

Thus, according to this embodiment, the gradient magnetic field power source 4 as a whole can be operated optimally, with a minimum amount of unproductive power capacity, by supplementing the basic power source unit 41 with a necessary number of power source elements 42a of the power source elements unit 42. This allows the maximum total power capacity of the gradient magnetic field power source to be as low as 1.73, in contrast to the conventional configuration, which has a maximum total power capacity of 3.

Also, for this reason, even in a case of using a modern imaging technique such as an echo planer method, in which the required power for the reading gradient magnetic field is much larger than the required powers for the slicing gradient magnetic field and the phase encoding gradient magnetic field, there is no need to provide a very powerful power source for each of the X-, Y-, and Z-gradient magnetic field coils.

Figure 6:
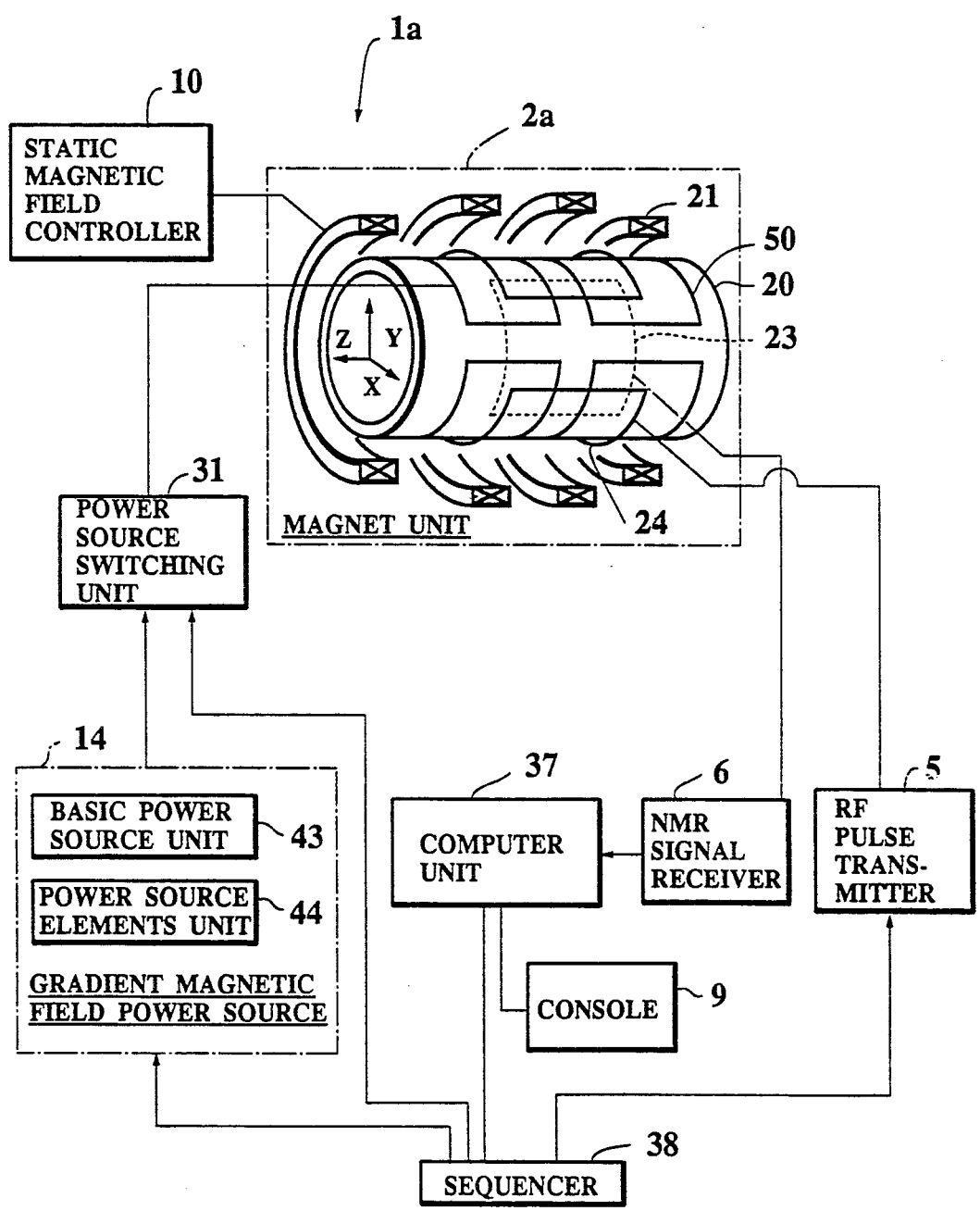
FIG. 6 is a schematic block diagram of another embodiment of a nuclear magnetic resonance imaging apparatus according to the present invention.

Referring now to FIG. 6, there is shown another embodiment of a nuclear magnetic resonance imaging apparatus according to the present invention.

In this embodiment, the nuclear magnetic resonance imaging apparatus 1a comprises a magnet unit 2a containing a static magnetic field coil 21, gradient magnetic field coils 50, a nuclear magnetic resonance (NMR) signal detector coil 23, and an RF pulse transmitter coil 24, all of which are provided on a coil core 20; a gradient magnetic field power source 14 for supplying currents to the gradient magnetic field coils 50, which includes a basic power source unit 43 and a power source elements unit 44 to be described in detail below; an RF pulse transmitter 5 for applying RF pulses to the RF pulse transmitter coil 24; a nuclear magnetic resonance signal receiver 6 for receiving the nuclear magnetic resonance signals detected by the nuclear magnetic resonance signal detector coil 23; a computer unit 37 for controlling operations of the apparatus; a sequencer 38 for controlling operations of the gradient magnetic field power source 14 and the RF pulse transmitter 5; a console 9 including a CRT display for displaying nuclear magnetic resonance images and a keyboard for entering commands such as imaging conditions; a static magnetic field controller 10 for controlling the static magnetic field coil 21, and a power source switching unit 31 containing a plurality of switches for selectively switching the power source elements 42 in order to control the currents supplied to the gradient magnetic field coils 50.

Here, those structural elements having the same labels as in the previous embodiment are identical to the structural elements of the previous embodiments, while those structural elements having the same names as in the previous embodiment but with different labels are playing similar roles as the corresponding structural elements of the previous embodiments but with some modifications.

Figure 7:
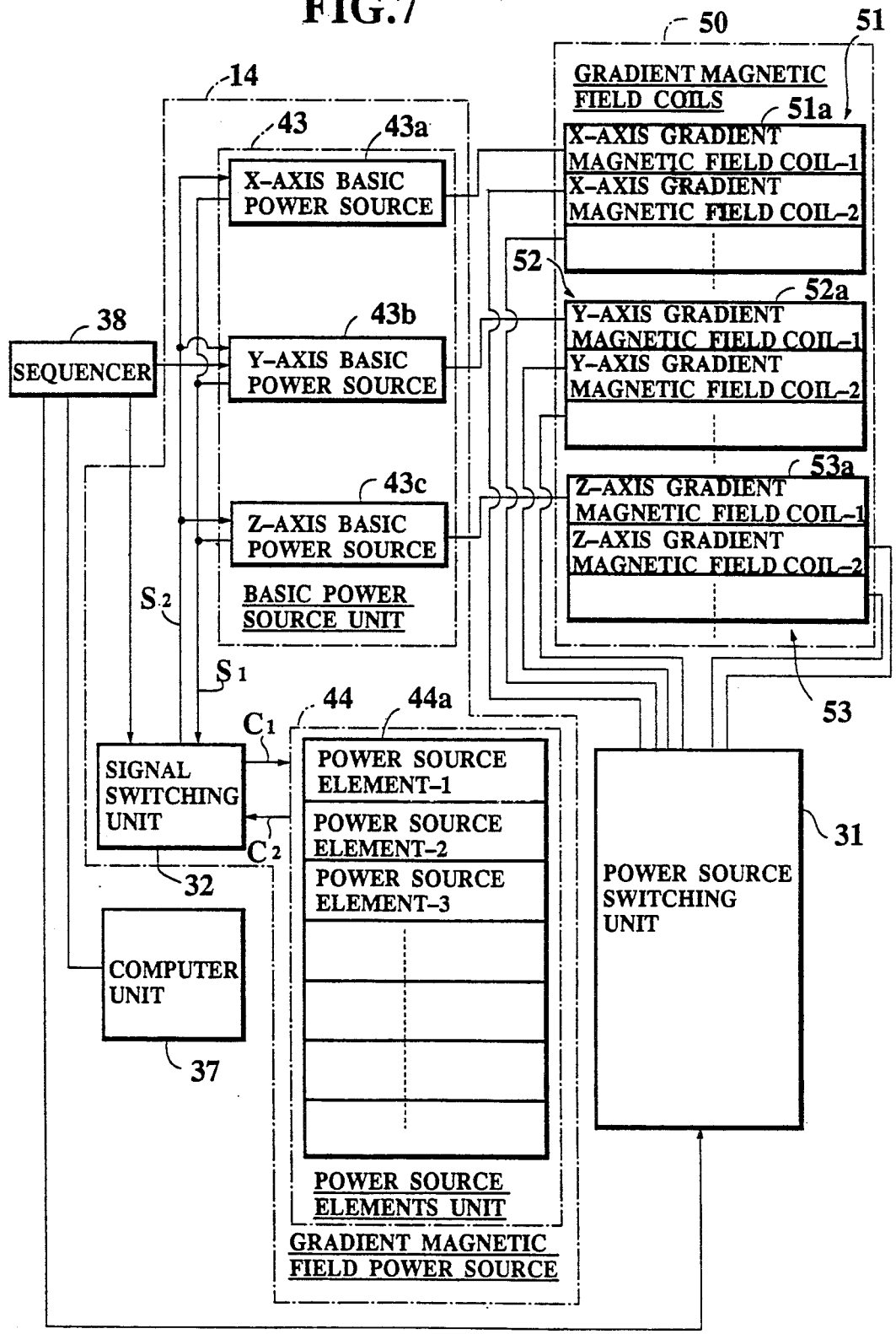
FIG. 7 is a detailed block diagram of a main portion of the embodiment of a nuclear magnetic resonance imaging apparatus of FIG. 6.

In detail, as shown in FIG. 7, the gradient magnetic field coils 50 comprises an X-axis gradient magnetic field coils 51, a Y-axis gradient magnetic field coils 52, and a Z-axis gradient magnetic field coils 53, where each of these X-, Y-, and Z-axis gradient magnetic field coils 51, 52, and 53 contain a plurality of mutually parallel individual coils 51a, 52a, and 53a, respectively, such as an X-axis gradient magnetic field coil-1, Y-axis gradient magnetic field coil-1, Z-axis gradient magnetic field coil-1, etc.

On the other hand, the basic power source unit 43 comprises an X-axis basic power source 43a, a Y-axis basic power source 43b, and a Z-axis basic power source 43c, in correspondence with the X-, Y-, and Z-axis gradient magnetic filed coils 51, 52, and 53, respectively. Each of these X-, Y-, and Z-axis basic power sources has 1/10 of a power capacity of a single conventional gradient magnetic field coil power source for one gradient magnetic field coil which is assumed to be 1.

Meanwhile, the power source elements unit 44 comprises a plurality of power source elements 44a such as a power source element-1, power source element-2, etc. Each power source element 44a of the power source elements unit 44 has the power capacity of less than 1/10.

Combining the basic power source unit 43 and the power source elements unit 44 together, the gradient magnetic field power source 14 has the power capacity of approximately 1.73.

Also, as shown in FIG. 7, the X-, Y-, and Z-axis basic power source 43a, 43b, and 43c are directly connected to the first individual coil of the X-, Y-, and Z-axis gradient magnetic field coils 51, 52, and 53, respectively, i.e., to the X-axis gradient magnetic field coil-1, Y-axis gradient magnetic field coil-1, and Z-axis gradient magnetic field coil-1, whereas the remaining individual coils, such as the X-axis gradient magnetic field coil-2, Y-axis gradient magnetic field coil-2, Z-axis gradient magnetic field coil-2, etc., are directly and separately connected to the power source switching unit 31. Consequently, in this embodiment, each individual coil of the gradient magnetic field coils 50 is separately incorporated in an independent closed circuit configuration.

The operation of the apparatus 1a of this embodiment is substantially the same as that of the previous embodiment, where each structural elements are functioning in the manner similar to the corresponding structural elements of the previous embodiment.

Namely, when the imaging conditions are specified at the console 9, in accordance with the specified imaging conditions, the computer unit 37 controls the sequencer 38 which in turn controls the gradient magnetic field power source 14 and the power source switching unit 31, such that the appropriate amounts of currents are supplied to the gradient magnetic field coils 50 by using the basic power source unit 43 and a necessary number of power source elements 44a of the power source elements unit 44.

The gradient magnetic field power source 14 further includes a signal switching unit 32 for converting a current C2 outputted by the power source elements unit 44 indicating an amount of current presently supplied by the power source elements unit 44 into a current level signal S2 to be given to the basic power source unit 43, and transmitting a current supply request signal S1 indicating an amount of current needed to be supplied from the power source elements unit 44, from the basic power source unit 43 to the power source elements unit 44.

The X-, Y-, and Z-axis basic power sources 43a, 43b, and 43c has a configuration similar to that shown in FIG. 4 for the previous embodiment.

It is obvious that, as in the previous embodiment, each of the X-axis gradient magnetic field, Y-axis gradient magnetic field, and Z-axis gradient magnetic field can be increased in units of an increment ΔG corresponding to the addition of one power source element from the power source elements unit 42, so that any other desired gradient magnetic field can be obtained by using suitable numbers of the power source elements for each gradient magnetic field component.

Thus, as in the previous embodiment, according to this embodiment, the gradient magnetic field power source 14 as a whole can be operated optimally, with a minimum amount of unproductive power capacity, by supplementing the basic power source unit 43 with a necessary number of power source elements of the power source elements unit 44. This enables the maximum total power capacity of the gradient magnetic field power source to be limited to 1.73, in contrast to the conventional configuration which has the maximum total power capacity 3.

Also, for this reason, even in a case of using a modern, imaging technique such as an echo planer method in which the required power for the reading gradient magnetic field is much larger than the required powers for the slicing gradient magnetic field and the phase encoding gradient magnetic field, there is no need to provide a very powerful power source for each of the X-, Y-, and Z-gradient magnetic field coils.

In addition, in this embodiment, because each individual coil of the gradient magnetic field coils 50 is separately incorporated in an independent closed circuit configuration, an interference among current supply lines from the basic power source unit 43 and the power source elements unit 44 can be avoided so that the gradient magnetic field can be produced stably, and a practical problem of making a stable joint between the current supply lines from the basic power source unit 43 and the power source elements unit 44 can be circumvented.

It is to be noted that many modifications and variations of the above embodiments may be made without departing from the novel and advantageous features of the present invention. Accordingly, all such modifications and variations are intended to be included within the scope of the appended claims.

What is claimed is:

1. A nuclear magnetic resonance imaging apparatus, comprising:
   means for generating a static magnetic field;
   X-, Y-, and Z-gradient magnetic field coils for generating gradient magnetic fields to be superposed on the static magnetic field in X, Y, and Z directions respectively;
   means for supplying a required amount of current to the gradient magnetic field coils, including:
   a basic power source for supplying a current up to a predetermined amount to the gradient magnetic field coils;
   a plurality of power source elements, each capable of supplying a prescribed amount of current;
   wherein said power source elements are connected to the basic power source in a configuration in which the basic power source is supplemented by a necessary number of said power source elements;
   wherein a total amount of current supplied by said basic power source and said power source elements becomes equal to the required amount of current when a sum of currents supplied by the power source elements is added to a current due to the basic power source;
   means for applying RF pulses onto an object to be examined placed in the static magnetic field;
   means for collecting nuclear magnetic resonance signals from the object to be examined resulting from the RF pulse; and
   means for processing the collected nuclear magnetic resonance signals.

2. The apparatus of claim 1, wherein: said means for supplying a required amount of current has a total power capacity equal to an amount of current capable of making said X-, Y-, and Z-gradient magnetic field coils generate a total gradient magnetic field of maximum magnitude.

3. The apparatus of claim 1, wherein:
   each of the X-, Y-, and Z-magnetic field coils includes a plurality of mutually parallel individual coils;
   each individual coil being separately incorporated in an independent closed circuit configuration by being directly connected with one of the basic power source and the power source elements.

4. A method of nuclear magnetic resonance imaging, comprising the steps of:
   generating a static magnetic field;
   generating gradient magnetic field to be superposed on the static magnetic field in X, Y, and Z directions by X-, Y-, and Z-gradient magnetic field coils;
   supplying a required amount of current to said gradient magnetic field coils, including the steps of:
   supplying current up to a predetermined amount to the gradient magnetic field coils by a basic power source;
   supplementing said basic power source with a plurality of power source elements, each capable of supplying a prescribed amount of current;
   connecting a necessary number of said power source elements to said basic power source;
   generating a sum of currents supplied by said power source elements;
   adding said sum to said current due to said basic power source;
   wherein a total amount of current supplied by said basic power source and said power source elements becomes equal to the required amount of current;
   applying RF pulses onto an object to be examined placed in the static magnetic field;
   collecting nuclear magnetic resonance signals from the object to be examined resulting from the RF pulse; and
   processing the collected nuclear magnetic resonance signals.

5. The method of claim 4, wherein:
said basic power source and said power source elements together have a total power capacity equal to an amount of current capable of making said X-, Y-, and Z-gradient magnetic field coils generate a total gradient magnetic field of maximum magnitude.

6. The method of claim 4, wherein:
each of the X-, Y-, and Z-magnetic field coils includes a plurality of mutually parallel individual coils;
each individual coil being separately incorporated in an independent closed circuit configuration by being directly connected with one of the basic power source and the power source elements.

* * * * *